US005541411A

United States Patent [19]
Lindquist et al.

[11] Patent Number: 5,541,411
[45] Date of Patent: Jul. 30, 1996

[54] IMAGE-TO-IMAGE REGISTRATION FOCUSED ION BEAM SYSTEM

[75] Inventors: John M. Lindquist, Portland; Richard J. Young; Eric S. Boleyn, both of Hillsboro, all of Oreg.

[73] Assignee: FEI Company, Hillsboro, Oreg.

[21] Appl. No.: 498,740

[22] Filed: Jul. 6, 1995

[51] Int. Cl.⁶ .................................................. H01J 37/26
[52] U.S. Cl. ................................. 250/309; 250/307
[58] Field of Search ........................... 250/304, 306, 250/307, 310, 311, 397, 442.1, 442.2, 442.3; 382/130, 145, 147

[56] References Cited

U.S. PATENT DOCUMENTS

| | | | |
|---|---|---|---|
| 3,326,176 | 6/1967 | Sibley | 118/6 |
| 4,393,311 | 7/1983 | Feldman et al. | 250/459.1 |
| 4,451,738 | 5/1984 | Smith | 250/492.2 |
| 4,683,378 | 7/1987 | Shimase et al. | 250/492.2 |
| 5,054,097 | 10/1991 | Flinois et al. | 382/44 |
| 5,086,230 | 2/1992 | Adachi et al. | 250/492.2 |
| 5,159,643 | 10/1992 | Kaga et al. | 250/307 |
| 5,278,408 | 1/1994 | Kakibayashi et al. | 250/307 |
| 5,401,972 | 3/1995 | Talbot et al. | 250/491.1 |

*Primary Examiner*—Jack I. Berman
*Assistant Examiner*—Kiet T. Nguyen
*Attorney, Agent, or Firm*—Dellett and Walters

[57] ABSTRACT

An image-to-image registration system employs interactive computer graphic systems to align and register a number of image representations of a particular device from a variety of sources including, for example, optical microscopic images, computer aided design representations, etc., to an image obtained by a focused ion beam system. The registration enables accurate alignment of the images to the FIB image so that subsurface features which may not be detectable via the FIB image may be located and used to guide operation of the FIB system for milling or conductor/insulator deposition or the like. Counting of aluminum grains is enhanced by use of the invention to register images of a sample taken at several different tilt angles. The registered images are combined to give a more accurate representation of grain boundaries, enabling a more accurate grain count.

5 Claims, 7 Drawing Sheets

IMAGE-TO-IMAGE REGISTRATION FOCUSED ION BEAM SYSTEM

This invention relates to focused ion beam (FIB) systems and more particularly to a focused ion beam system which allows interrelation of an FIB image with other images or representations of the object which has been imaged by the FIB system.

BACKGROUND OF THE INVENTION

Focused ion beam systems can be used in forming, shaping or altering microscopic structures in semiconductor devices or other solid materials. The focused ion beam is directed to a small point on a semiconductor device and then scanned, raster fashion, over a particular area where material is to be removed or deposited. As an ion impinges upon the semiconductor device surface, its momentum is transferred and can result in the removal of one or more surface atoms according to a process called sputtering. By selecting a raster pattern of a given overall shape, for example a horizontal raster pattern, a correspondingly shaped area of surface material can be removed or conductive material can be deposited if a particular metal containing compound is adhered to the semiconductor device. Insulating material may also be deposited upon a specific area of a substrate by directing an ion beam toward a substrate simultaneously with the introduction of a gaseous compound. The beam irradiated upon the substrate in the presence of the gaseous compound forms an insulating film.

Figure 1:
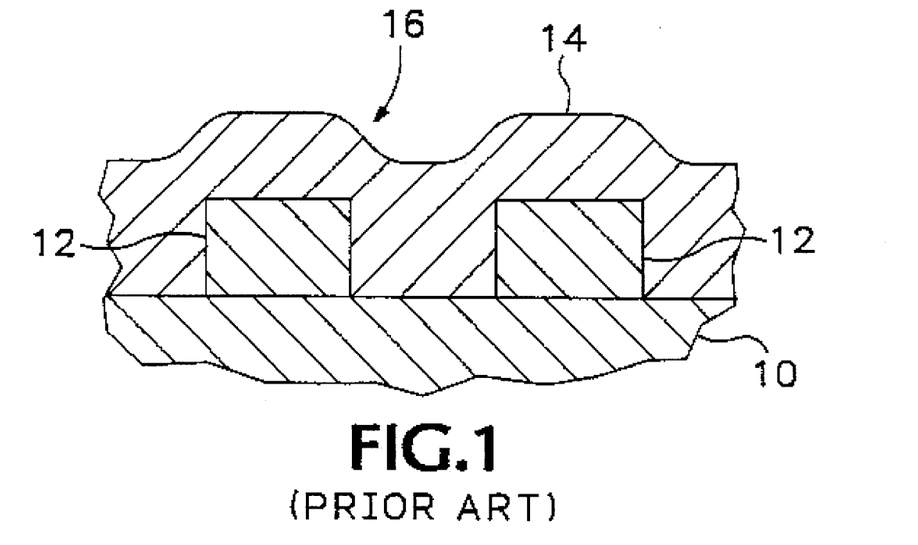
FIG. 1 is a cross sectional view of a portion of a device employing previous manufacturing techniques.

Any of the various layers of a semiconductor device may be operated upon with a FIB system, for example, by removing material down to the layer of interest, and selectively adding conductive or insulative material or removing portions of the same so as to accomplish the desired modification of the semiconductor device. However, subsurface features of objects are often not visible in focused ion beam images. Heretofore, in semiconductor device design and manufacture, for example, it has been possible to use a focused ion beam system to image the surface of the semiconductor device. Portions of subsurface layers of the device could be located via specific landmarks on the device being observed by using the topography of the surface to direct the positioning of the ion beam in relation to subsurface features. Referring now to FIG. 1, which is a cross section view of a portion of a device constructed using previous manufacturing styles, a pair of conductors 12 are deposited on a substrate 10 and are covered by an insulation layer 14. It may be observed at location 16, for example, the insulation layer has a series of hills and valleys formed therein as a result of deformations from passing over the top of the conductors 12. Accordingly, an adequate FIB image can be obtained since the hills and valleys provide sufficient detectable topography to enable the locating of subsurface features.

Figure 2:
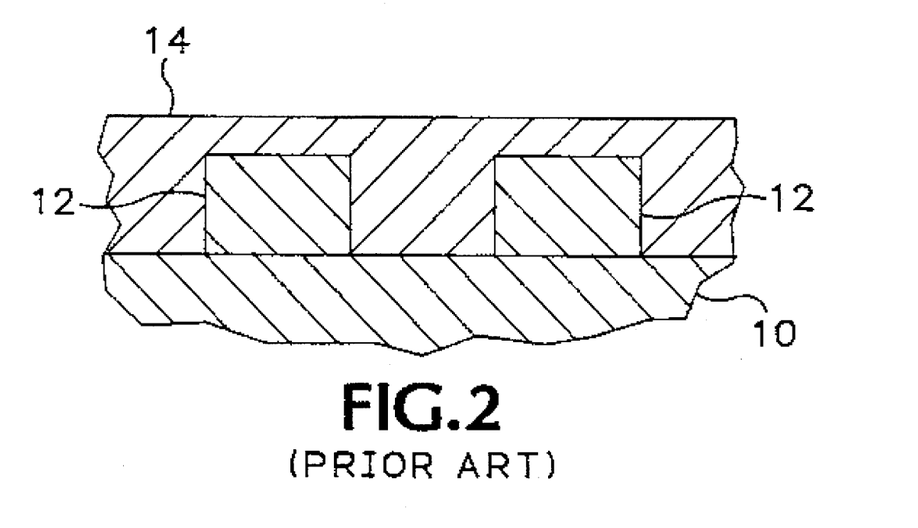
FIG. 2 is a cross sectional view of a device manufactured using planarization techniques.

However, recent fabrication methods involve planarization, as illustrated in FIG. 2, wherein the upper layer 14 has been planarized, by polishing or the like, to create a smooth surface topography so as to provide a level surface for subsequent layer deposition. Without planarization, additional layers which are added on top of existing layers develop increasingly steeper hills and valleys which can result in undesirable performance characteristics for the electronic device being manufactured. However, the planarization of the various layers removes any variation in topography of subsequently deposited layers resulting in difficulty in locating subsurface features through observation with a focused ion beam system.

Accordingly, when planarization is employed to provide a smooth surface on which to deposit further layers, in accordance with the prior art, one method employed to overcome the inability to observe below surface features of planarized devices with an ion beam system has been to employ a high precision X-Y stage upon which the sample being observed is mounted. Then, precise movements are employed from known starting or reference points in order to position the sample below the ion beam so as to have the beam strike the sample at the desired position. However, high precision stages are expensive and add significantly to the cost of a system.

SUMMARY OF THE INVENTION

In accordance with an embodiment of the present invention, a system for registration of images in a focused ion beam system includes means for registering an image from a second source to a focused ion beam image thereby enabling correlation of points in the secondary image to points on the focused ion beam image to enable operation at precise locations with relation to subsurface features.

In accordance with a second embodiment of the present invention, counting of aluminum grains or the like is accomplished by obtaining images at first, second and third tilt angles, and aligning the three images to one another, performing edge detection to generate outlines of the borders of grains in each of the images and superimposing the three images on one another to form a composite outline image.

It is accordingly an object of the present invention to provide an improved focused ion beam system which enables correlation of a focused ion beam image with images from other sources to enable positioning based on the secondary images.

It is another object of the present invention to provide an improved system wherein accurate grain border detection is accomplished to enable more accurate counting of aluminum grains or other metal grains for analysis of fabrication procedures.

It is a further object of the present invention to provide an improved focused ion beam system which enables precision locating of a focused ion beam without requiring use of a high precision stage.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 3:
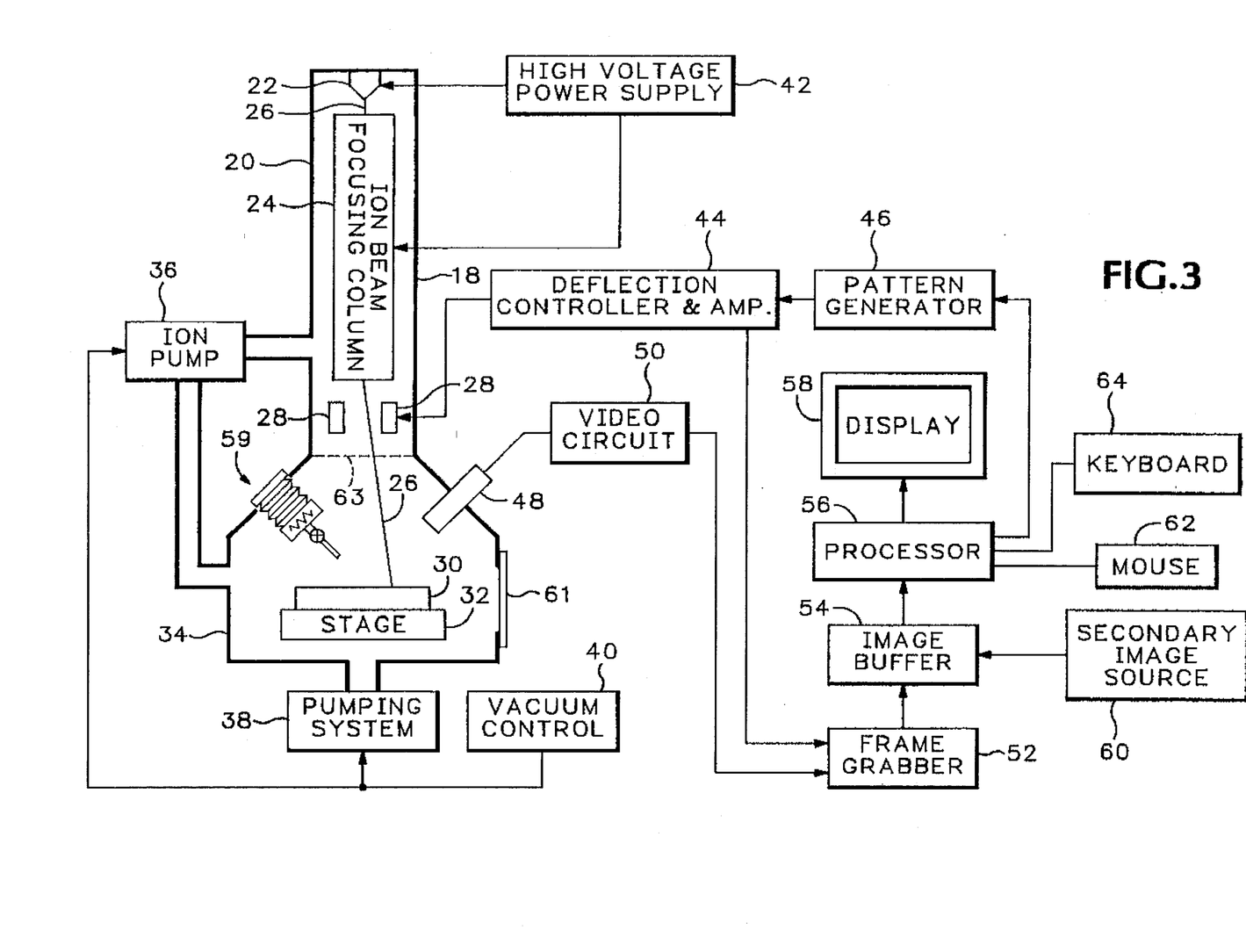
FIG. 3 is a schematic representation of a focused ion beam system employing image-to-image registration in accordance with the present invention.

Referring to FIG. 3, illustrating a focused ion beam system for carrying out the present invention, an evacuated envelope 18 includes an upper neck portion 20 within which are located a liquid metal ion source 22 and a focusing column 24 which includes extractor electrode means and an electrostatic optical system. Ion beam 26 passes from source 22 through column 24 and between electrostatic deflection means schematically indicated at 28 toward sample 30, which suitably comprises a semiconductor device positioned on movable 5-axis stage 32 within lower chamber 34. The 5-axis stage provides X, Y and Z axis movement as well as rotation R and tilt T. An ion pump 36 is employed for evacuating neck portion 20. The chamber 34 is evacuated with turbomolecular and mechanical pumping system 38 under the control of vacuum controller 40.

High voltage power supply 42 is connected to liquid metal ion source 22 as well as to appropriate electrodes in focusing column 24 for forming an approximately 25 keV ion beam 26 and directing the same downwardly. Deflection controller and amplifier 44, operated in accordance with a prescribed pattern such as a raster pattern provided by pattern generator 46, is coupled to deflection plates 28 whereby beam 26 may be controlled to trace out a corresponding pattern on the upper surface of sample 30.

The source 22 typically provides an ion beam of gallium, although other ions can be used, for example, indium, aluminum, argon, helium, etc. The source is capable of being focused into a sub 0.1 micron width beam at sample 30 for either modifying the surface 30 by removing material or by providing an insulating layer or a metal layer or for the purpose of imaging the surface 30. An electron multiplier 48 used for detecting secondary emission for imaging is connected to video circuit and amplifier 50, the latter supplying drive for frame grabber 52 also receiving deflection signals from controller 44. The frame grabber provides data to image buffer 54 which also obtains information from secondary image source 60. Images stored within image buffer 54 are supplied to processor 56 which drives display 58 as well as pattern generator 46. Commands may be supplied to the processor via keyboard 64 and mouse 62. The processor may also include memory as well as long term storage (i.e., disk drives) wherein the processor, keyboard, mouse, memory and display all comprise a computer. In a preferred embodiment, the computer comprises a 486 compatible PC running in a Windows operating environment. The processor is adapted to take images from the image buffer as provided by the secondary image source and frame grabber 52 via video circuit 50 and electron multiplier 48 and provide appropriate displays on the display monitor 58. The displays are suitably presented as windows under the Windows operating environment.

A source 59 is located inwardly of the side of chamber 34 and is positionable to aim a gaseous vapor directly toward a region on the top surface of sample 30 where an insulating film is to be selectively deposited, for example. A door 61 provides access to allow inserting and removing sample 30. A gate valve, illustrated schematically at 63, is closed before door 61 can be opened to seal off the ion source and focusing column apparatus.

Figure 4:
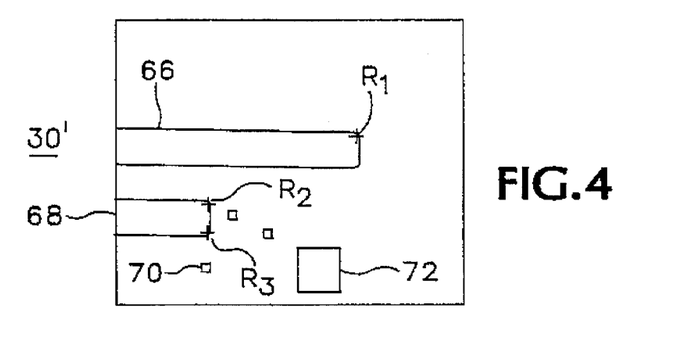
FIG. 4 is a representation of a focused ion beam image of a device having planarized layers.

Referring to FIG. 4, which is a representation of a focused ion beam image of a particular device 30' as obtained with the system of FIG. 3, it will be observed that surface formations comprising two conductors 66 and 68 may be observed on this particular device as well as several apertures 70 and 72 which have been bored into the sample 30' by use of the FIB system. The image of FIG. 4, as well as those of FIGS. 5–7 and 9–18, are suitably presented as windows on display monitor 58 (FIG. 3). Note, however, that since the lower layers of the particular device have been planarized, little information about subsurface layers is obtainable by use of the focused ion beam imaging system.

Figure 5:
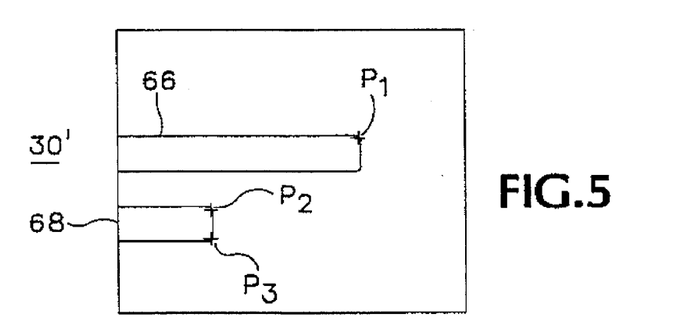
FIG. 5 is a representation of an optical microscope view of the same device illustrated in FIG. 4, wherein the microscope is focused to the surface layer of the device.

FIG. 5 is a representation of a digitized optical microscope image of the specimen 30' of FIG. 4 with a similar field of view, but focused on the surface of the specimen. The image is suitably obtained before the specimen is placed within the chamber 34, but could be obtained while the specimen is within the chamber. The time sequence of obtaining the various images is not crucial; the images may be acquired real-time or may be stored images.

Figure 6:
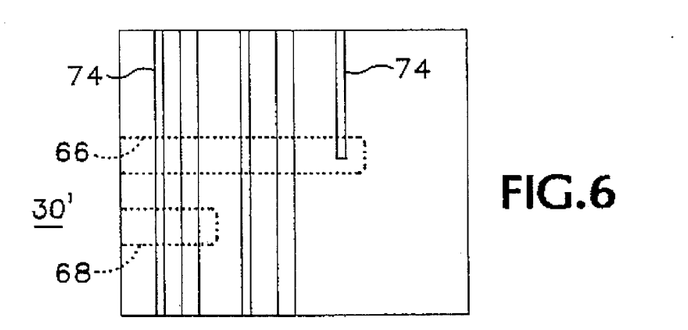
FIG. 6 is a representation of an optical microscope view of the device of FIG. 5, wherein the microscope is focused to a first layer below the surface of the device.

FIG. 6 is a second digitized optical microscope image view of the specimen of FIG. 5 wherein the image is focused to clearly view a first layer below the surface layer. It may observed that the conductors 66 and 68 are visible but out of focus and a series of lower layer conductors 74 are clearly discernible. These lower layer conductors were not detectable via the focused ion beam image, because of the planarization that was employed during fabrication.

Figure 7:
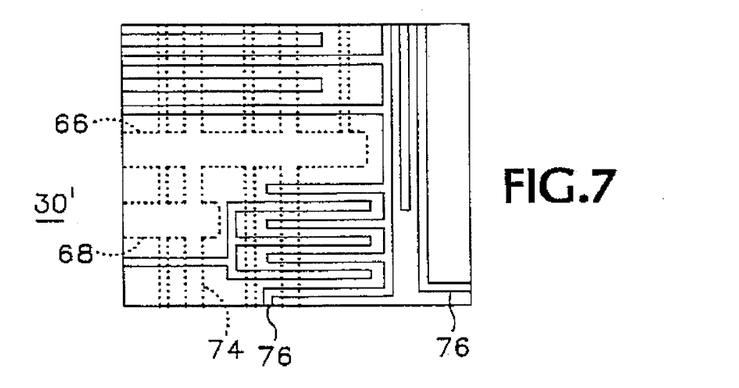
FIG. 7 is an optical microscope representation of the device of FIGS. 5 and 6 focused to a second lower layer of the device.

FIG. 7 shows a representation of a third digitized optical microscope image of the same specimen 30' but a still lower layer is in focus, with the upper layers out of focus. A series of traces 76 present at this layer are visible in this image.

Ideally, a design engineer or other user of the focused ion beam system would like to be able to select an area for an ion milling operation wherein material of the specimen 30 is selectively removed and deposited by use of the FIB system, for example, by reference to the visible traces of FIG. 7 or FIG. 6. However, since, as noted hereinabove, no subsurface information is available via the ion beam image, such operations with the ion mill system would heretofore necessitate use of a high precision stage to enable accurate positioning of the sample relative to the focused ion beam. Accordingly, the present invention enables the three images of FIGS. 5, 6 and 7 to be registered with the focused ion beam image of FIG. 4, providing one-to-one correspondence between each image, compensating for tilt, translation, rotation, scaling and the like. Accordingly, once the images are registered, the user may select a point on any image and be ensured that the ion mill system will perform its operation (for example, milling a hole in the device) at the correct position on the actual device since the focused ion beam may be accurately directed to any selected position.

The registration operation comprises selecting three points on the focused ion beam image and three corresponding points on the chosen other image to be aligned. Accordingly, referring to FIG. 8, which is a flow chart of the operational steps of the performance of the registration of the images, together with FIGS. 4 and 5, the registration process will be explained in greater detail. The registration begins with step 80, wherein three points are selected on the reference image, for example the focused ion beam system image of FIG. 4. These may be any three points and they are suitably selected interactively via use of mouse 62 (FIG. 1) in conjunction with visual feedback from display 68 (FIG. 1). In the illustrated example, R1, R2 and R3 are chosen as points on the conductor layer visible in the FIB image. Next, in step 82, three corresponding points are selected on a prior image, for which registration is desired. In the present example, the image to be aligned is that of FIG. 5, so three points (P1, P2, P3) are chosen. It will be noted that the three chosen points in FIG. 5 correspond to the features which were chosen as the three reference points in FIG. 4. With the user having chosen the three points in both the reference image and the prior image, then in step 84, the process determines a transform T between the points of the reference image (R1, R2, R3) and the points on the prior image (P1, P2, P3) such that T(P1)=R1, T(P2)=R2, and T(P3)=R3. Since the coordinate locations of the points are known within the particular coordinate system of the screen, the transformation between points is readily determined by linear algebra methods. Once the transform operation T has been determined, then a new empty (i.e., blank) image is created in step 86 whereupon in step 88, a loop is entered and a first pixel is selected in the new image. Once the pixel is selected, a determination is made in decision block 90 as to whether all pixels have been processed. If all pixels have been processed, then the registration is completed and the process exits. However, if all pixels have not been processed, then step 92 is performed wherein using the coordinate transform T determined in step 84, a corresponding pixel from the prior image is selected. The selected pixel data from the prior image is then read (step 94) from the prior image into the selected pixel position of the new image. If the transform has mapped the selected position of the new image outside of the boundary of the prior image, then null data is placed in the new image position. This null data could comprise a blank representation or a black background representation, for example. Next, the process loops back, to again execute step 88 wherein a next pixel is selected in the new image and the process continues in an iterative manner looping through steps 88, 90, 92 and 94 until such time as all pixels in the new image have been processed.

Figure 9:
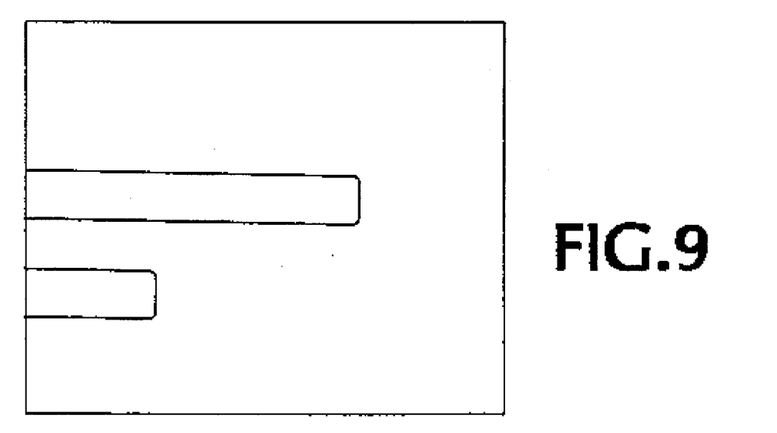
FIG. 9 is a representation of the view of FIG. 5 after alignment in accordance with the present invention.
Figure 10:
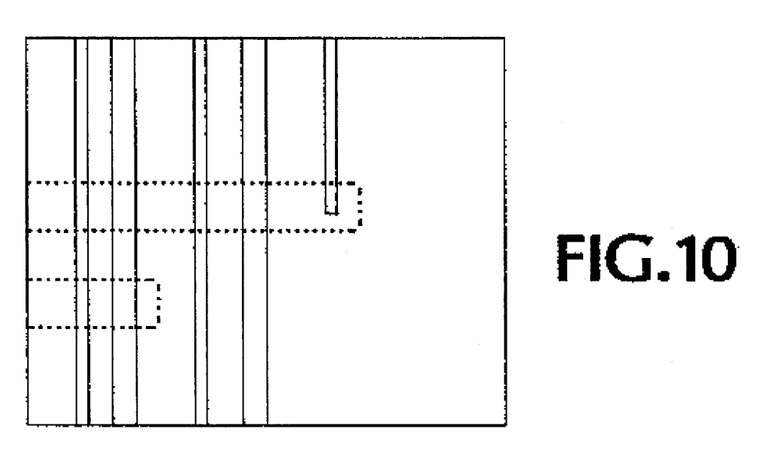
FIG. 10 is a representation of the view of FIG. 6 after alignment in accordance with the present invention.
Figure 11:
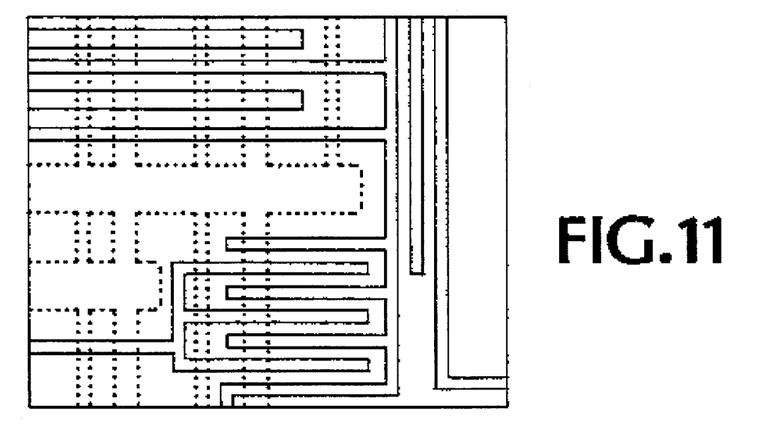
FIG. 11 is a representation of the view of FIG. 7 after alignment in accordance with the present invention.

The new image may be somewhat skewed relative to the original images, since the transform operation will accommodate translation, rotation, scaling and tilt angle differences between the images. Such skewing is shown in FIG. 9, which is a representation of the view of FIG. 5 after registration to the FIB image. FIGS. 10 and 11 show similarly aligned images at other focus depths, corresponding to FIGS. 6 and 7. In the particular example, since the images from the optical microscope were all at the same field of view, having merely been focused to different layers, the registration of the images to both FIGS. 10 and 11 is easily accomplished by reapplying the transformation function wherein the prior image becomes the image at the other focus depths.

According to the above described steps, image-to-image registration is accomplished by selecting three corresponding points in first and second (and optionally third, fourth, etc.) images and a transformation between the corresponding points is determined and applied to the images to be registered to produce an appropriately registered output image. A user is then able to accurately select subsurface features, for example, in relation to which focused ion beam operations are to be performed, with the assurance that the subsurface location is accurately operated upon without chance of mispositioning of the ion beam. The steps are suitably performed by processor 56 (FIG. 3) wherein the various images are bit mapped images stored in image buffer 54 and shown on display 58.

Figure 12:
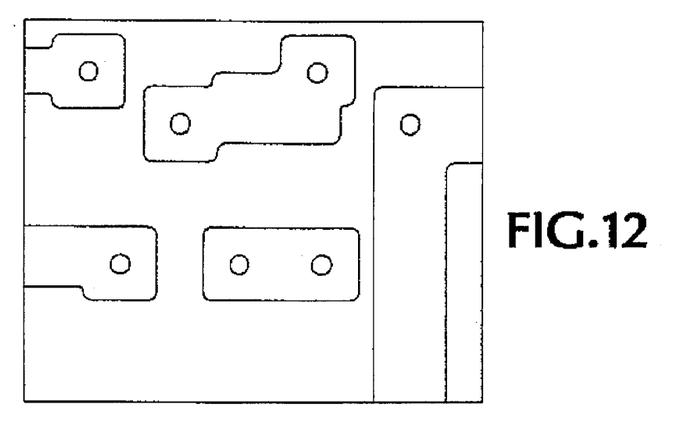
FIG. 12 is a focused ion beam view of another device.
Figure 13:
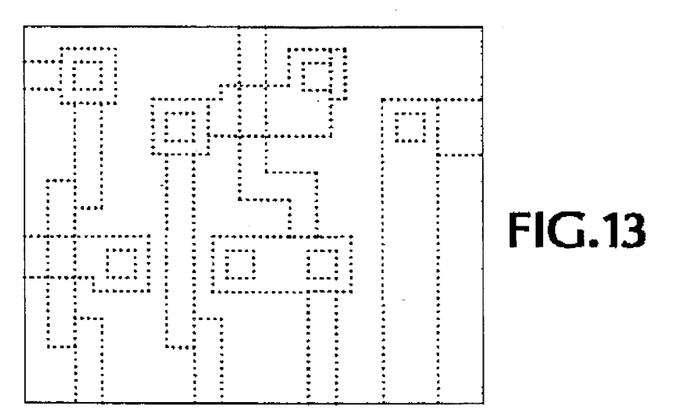
FIG. 13 is a view of a computer aided design representation of the device of FIG. 12.
Figure 14:
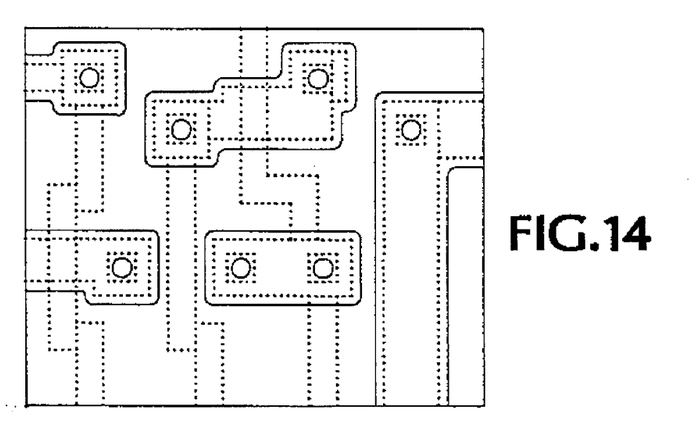
FIG. 14 is a view of the focused ion beam image of FIG. 12 with the corresponding computer aided design representation of the device superimposed thereon and aligned thereto in accordance with the present invention.
Figure 15:
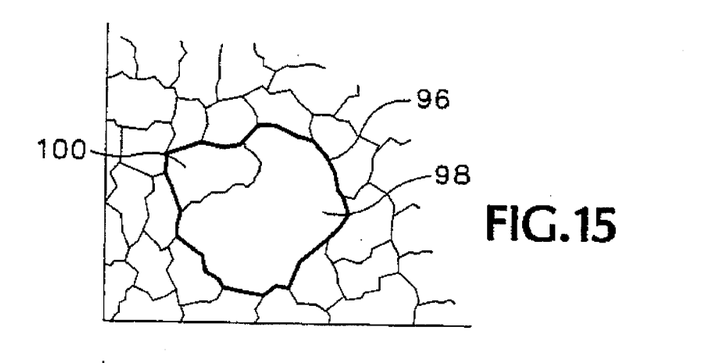
FIG. 15 is a representation of an image of aluminum grains acquired via ion channeling contrast at a first tilt angle.

FIGS. 12–14 show another application of the system according to the present invention wherein a focused ion beam system image of the surface of a device of FIG. 12 can be aligned to the corresponding computer aided design representation of the device (shown in FIG. 13). The registered computer aided design representation is then overlayed on the FIB image so that the actual surface fabrication may be compared with the computer aided design representation of the device with accurate adjustments for scaling differences, misalignment, tilting or the like. Operations may then be performed and observations made without requiring use of an expensive high-precision stage and alignment procedures.

In addition to the examples presented herein, the images or representations may be obtained from any suitable source, and may comprise SEM, TEM, or other scanned or non-scanned images.

Figure 16:
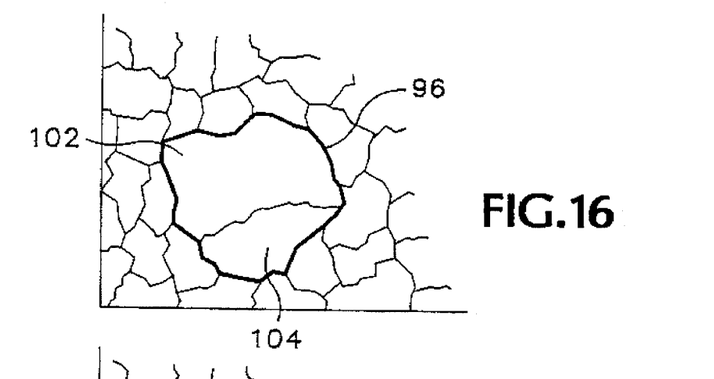
FIG. 16 is a second image corresponding to the image of FIG. 15 acquired at a second tilt angle.
Figure 17:
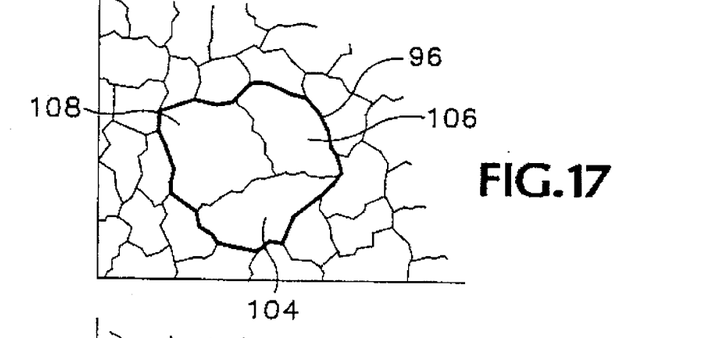
FIG. 17 is an image corresponding to the images of FIGS. 15 and 16 acquired at a third tilt angle.
Figure 18:
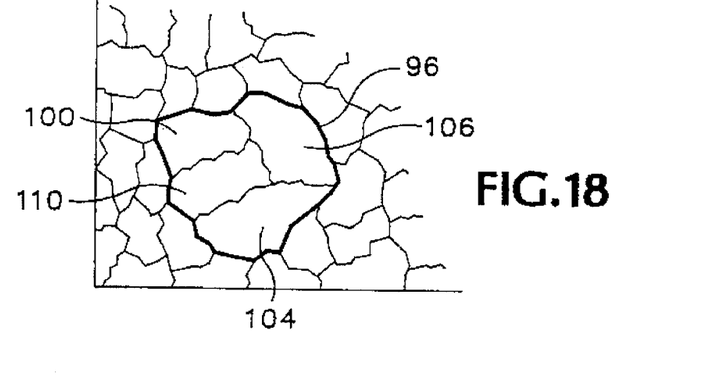
FIG. 18 is the resulting combination image obtained from the three aligned images.

A further application of the present invention involves identification of aluminum grains, for example, via ion channeling contrast imaging. In manufacturing operations, the size of aluminum grains can give valuable feedback to whether fabrication processes are being properly maintained. Determining such grain identification heretofore has involved taking a sample, for example, of a contact pad of a semiconductor device and observing and counting the number of aluminum grains in a given sample area. However, the nature of the grains is such that the appearance of grain boundaries in the ion channeling contrast image can vary when the angle of tilt of the sample relative to the ion beam varies. Accordingly, with reference to FIG. 15, which is a representation of an ion channeling contrast image of a sample of an aluminum contact pad at a 15° tilt angle, a given area 96 appears to be one large aluminum grain 98 and one smaller grain 100. However, as illustrated in FIG. 16 at a second tilt angle (for example, 20°) the region 96 now appears to be two grains 102 and 104 since different grain boundaries are visible which are not discernible at the first angle. At a third tilt angle (for example, 25° as shown in FIG. 17), the corresponding region 96 is visible as being three separate grains, 104, 106 and 108. Of course, other portions which may appear to be three grains at a 15° tilt, for example, may appear to be two, one or any other number of grains at other tilt angles.

Figure 8:
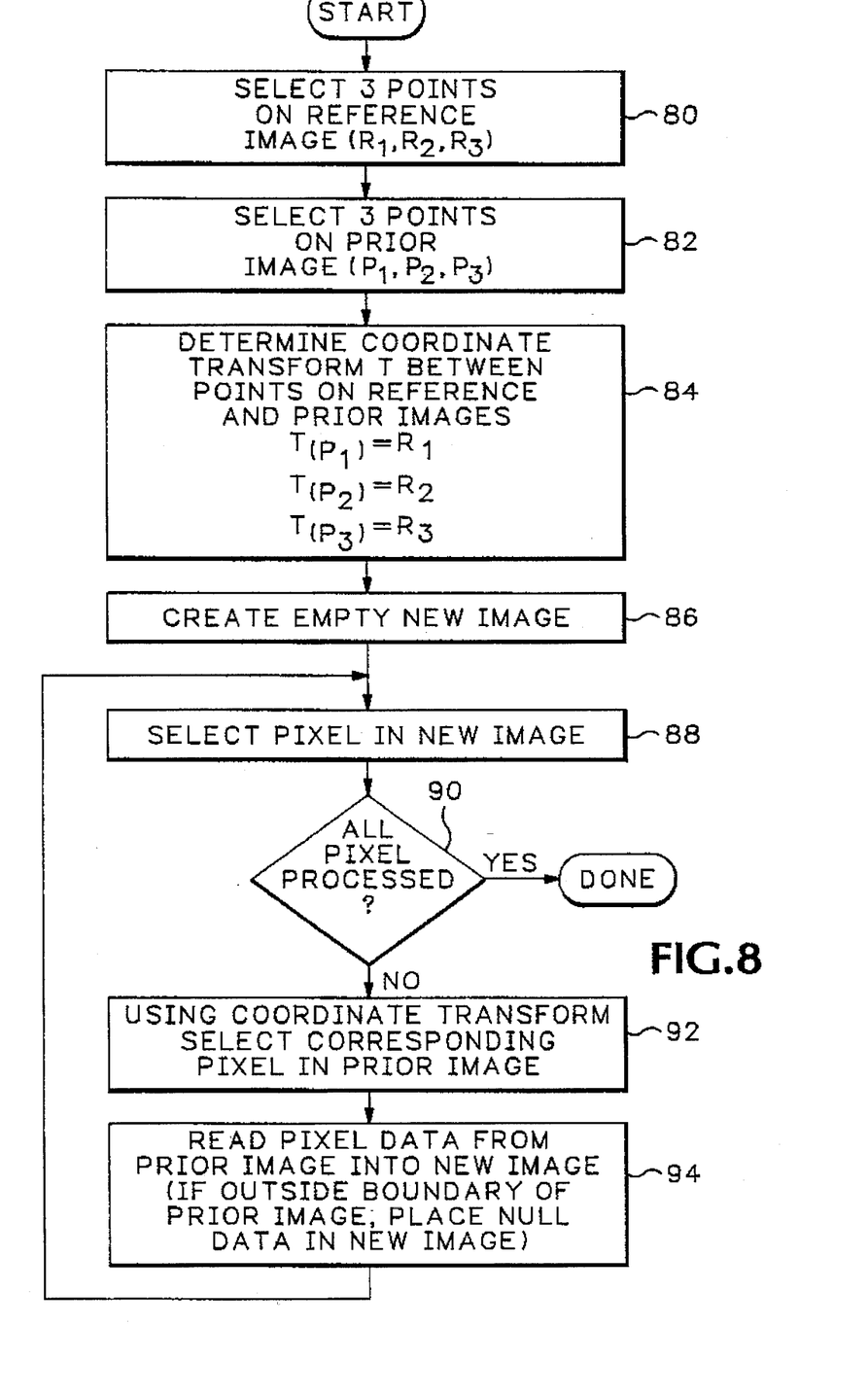
FIG. 8 is a flow chart of the operational steps performing the registration of the images in accordance with the present invention.

Accordingly, the present invention may be applied to register each of the three tilt angle images to one another, by performing the steps of FIG. 8, including selecting three corresponding points in each of the images. Once the three images are registered, they may then be combined by superimposing, for example using an image mathematical operation, which may comprise a logical OR of the corresponding pixels of each image, to provide a composite image which will show the grain boundaries in one composite image. The grain count is then more accurate. The actual grain counting is suitably performed automatically by presentation of the combined image to a commercially available software package, suitably Image Pro Plus grain counting software manufactured by Media Cybernetics, Inc., of Silver Springs, Md.

Thus, the present invention enables location of subsurface features in a focused ion beam system by observation, after registration of images from secondary sources, e.g., an optical microscope image or computer aided design image, to an FIB image. Images from other sources may also suitably be registered to the FIB image. Also, the present invention enables more accurate identification of aluminum grains, for example, by registration of multiple images acquired at various tilt angles to enable accurate delineation of grains for the purpose of counting and measuring grain size. The invention removes the need for a high precision stage and the corresponding precision movements from a known starting point, since known features may be selected and registered to enable all features to be accurately registered to a given image.

While plural embodiments of the present invention have been shown and described, it will be apparent to those skilled in the art that many changes and modifications may be made without departing from the invention in its broader aspects. For example, while the first image is an FIB image in the preferred embodiment, other imaging means may be employed. The appended claims are therefore intended to cover all such changes and modifications as fall within the true spirit and scope of the invention.

We claim:

1. A method of preparing an image of a sample for counting grains comprising the steps of:

imaging the sample with a focused ion beam system with the sample positioned at a first tilt angle relative to the focused ion beam to generate a first representation of the sample;

imaging the sample with the focused ion beam system with the sample positioned at a second tilt angle relative to the focused ion beam to generate a second representation of the sample;

registering said second representation to said first representation to provide a first registered representation; and combining said first representation and said first registered representation to provide a composite image of the sample.

2. The method according to claim 1 further comprising the steps of:

imaging the sample with the focused ion beam system with the sample positioned at a third tilt angle relative to the focused ion beam to generate a third representation of the sample; and registering said third representation to said first representation to provide a second registered representation, and wherein said combining step further comprises combining said second registered representation with said first representation and said first registered representation to provide said composite image of the sample.

3. The method according to claim 1 wherein said registering step comprises:

selecting a first set of points from the first representation and a second set of points from the second representation;

determining a transformation between said first set of points and said second set of points; and transforming said second representation with said determined transformation to generate a transformed representation, thereby registering said second representation to said first representation.

4. The method according to claim 1 wherein said first and second representations and said first registered representation comprise bit-mapped representations and wherein said combining step comprises logical combination of corresponding bits from said first representation and said first registered representation.

5. The method according to claim 1 further comprising the step of providing said composite image to a grain counting process.

* * * * *